United States Patent [19]
Ibrahim

[11] Patent Number: 5,198,885
[45] Date of Patent: Mar. 30, 1993

[54] CERAMIC BASE POWER PACKAGE

[75] Inventor: Shawki S. Ibrahim, W. Lafayette, Ind.

[73] Assignee: CTS Corporation, Elkhart, Ind.

[21] Appl. No.: 701,492

[22] Filed: May 16, 1991

[51] Int. Cl.⁵ .................... H01L 23/02; H01L 23/12
[52] U.S. Cl. .................... 257/701; 361/389; 361/394; 439/67; 439/71
[58] Field of Search .............. 357/74, 79, 80, 81; 439/67, 77; 361/389, 380, 390, 399, 400, 394

[56] References Cited

U.S. PATENT DOCUMENTS

| | | | |
|---|---|---|---|
| 3,585,272 | 6/1971 | Shatz | 174/524 |
| 3,735,213 | 5/1973 | Kansky | 357/74 |
| 3,769,560 | 10/1973 | Miyake et al. | 174/52.5 |
| 4,012,093 | 3/1977 | Crane | 439/77 |
| 4,227,036 | 10/1980 | Fitzgerald | 357/81 |
| 4,374,603 | 2/1983 | Fukunaga et al. | 439/77 |
| 4,753,005 | 6/1988 | Hasircoglu | 439/77 |
| 4,791,075 | 12/1988 | Lin | 437/209 |
| 4,808,113 | 2/1989 | Kanesige et al. | 439/67 |
| 4,934,946 | 6/1990 | Ordway | 439/77 |
| 4,987,478 | 1/1991 | Braun et al. | 357/81 |

OTHER PUBLICATIONS

Stuckert, "Transmission Line Connector" IBM Tech. Dicclosure Bull. vol. 8 No. 4 Sep. 1965 pp. 518-519.

*Primary Examiner*—Rolf Hille
*Assistant Examiner*—David Ostrowski
*Attorney, Agent, or Firm*—Albert W. Watkins

[57] ABSTRACT

A high power, hermetic, low cost, high reliability package for electrical devices is described. The package includes in the preferred embodiment an aluminum nitride substrate, copper thick film ink screen printed and fired upon the substrate, a Kovar ring brazed to the copper thick film ink, a thermally dissipating device mounted, the device bonded to electrical feed-throughs that pass through the Kovar ring, and a cover bonded to said Kovar ring to form an additional part of the hermetic seal.

11 Claims, 1 Drawing Sheet

CERAMIC BASE POWER PACKAGE

BACKGROUND OF THE INVENTION

1. FIELD OF THE INVENTION

This invention pertains to packaging for power semiconductor devices generally, and specifically to hermetic packaging using a minimum number of interfaces between a semiconductor device and a heat sink.

2. DESCRIPTION OF THE RELATED ART

As electronic devices continue the trend towards more complexity and greater capability combined into an ever shrinking package, new ways are continually sought to package the devices. In the early days of electronics, vacuum tubes performed a variety of functions from amplification of electrical signals to switching and regulation of power supplies used to run motors, radios and other devices. With the advent of the transistor, semiconductor devices made from materials such as silicon, germanium, gallium-arsenide and other similar materials have gradually replaced the vacuum tube while simultaneously creating new applications. The reduction in power required to operate the transistor led to much more compact packaging since less thermal energy had to be dissipated from the package.

The advent of high power semiconductors has led to the nearly complete replacement of vacuum tubes by transistors. In the process, applications where many kilowatts of power are to be controlled may be managed by these semiconductors. Further, where high level integration must be achieved by use of a circuit board highly populated with closely spaced semiconductor devices, a large amount of thermal energy per unit area must be dissipated. These demands for greater integration in smaller packages and greater power handling capabilities in the same package size, all with equal or improved reliability, continue to drive developments in improved packaging.

In the prior art, the need for greater power dissipation is usually addressed through the use of metallic devices having large surface area, commonly referred to in the art as heat sinks. Various arrangements of fins and surface contours are commonly provided to increase the total surface area from which heat may be conducted, radiated, or otherwise removed. The material chosen is typically aluminum, due to good thermal conductivity combined with environmental stability. Attachment of the semiconductor device to a metallic heat sink may not be achieved through direct coupling since aluminum and other metals are electrically conductive and the heat sink would act to short circuit the device. Primarily because metals generally have better thermal conductivity than other materials, much opportunity for widely varying design has been created by the need for an electrical insulator between the semiconductor device and a metal heat sink.

Several methods aimed at improving thermal dissipation involve providing a thin dielectric layer between the semiconductor device and a metal heat sink. This has been the traditional approach at high power packaging for transistors, beginning shortly after the advent of the bipolar transistor. One popular package design is illustrated in U.S. Pat. No. 3,585,272. In that patent, a semiconductor device is mounted to an alumina substrate via a multi-layer bonding process wherein molybdenum, with a thermal expansion coefficient matching the silicon chip, is used to bond directly to the chip. Under the molybdenum layer is a heat dissipating copper slug which in turn is solder bonded to a gold film formed on the surface of the alumina substrate. The alumina is then thermally attached to an aluminum heat sink via "pliable, soft, high heat conductivity material." Silicone heat conductive grease is given as an example of one such material. In this patent, there are six layers between the device and the heat sink, including molybdenum, copper, solder, gold, alumina, and thermal grease. Clearly, the application of six different layers can lead to a multitude of problems that adversely affect the thermal performance of the package and add substantially to the manufactured cost of the device.

A similar concept is illustrated in U.S. Pat. No. 3,769,560 wherein a device is bonded to a beryllia substrate that is then attached to a large copper heat sink. U.S. Pat. No. 3,735,213 discloses a package having a glass or glass-ceramic substrate with a Kovar frame. In this package very poor thermal conductivity will occur between a mounted device and the exterior, owing to the poor thermal conductivity of glasses and glass-ceramics and the lack of heat sink. U.S. Pat. No. 4,227,036 discloses a copper heat sink laminated on one side with molybdenum and opposite the molybdenum, a ceramic substrate upon which components are presumably mounted. Upon the ceramic substrate is a ceramic side wall, and a Kovar or ceramic cap to close the package after wire bonding. The molybdenum under layer is required to compensate for the differing coefficients of thermal expansion between the copper and ceramic that would otherwise result in bowing of the substrate.

More recently, work has progressed on ceramic heat sink members not requiring the usual insulator interspersed between the semiconductor and the heat sink. U.S. Pat. No. 4,791,075 illustrates a ceramic substrate, described as being fabricated from silicon carbide, alumina, or aluminum nitride having through holes exterior to the hermetic device region, with lead-throughs passing out of the hermetic zone underneath a cap of ceramic or metal. U.S. Pat. No. 4,987,478 illustrates a device bonded to an aluminum nitride heat sink having interconnects directly bonded to the device that extend through a similar substrate to a package exterior.

SUMMARY OF THE INVENTION

The foregoing patented concepts are deficient in one or more of the critical areas for a good package: ruggedness; high reliability; excellent thermal conductivity; hermeticity; and compatibility with existing package outlines. The present invention teaches a ceramic substrate, to which semiconductor devices and or other electrical components may be mounted, integrally attached to a frame having extensions that may be used for package attachment and also having holes through which electrical interconnects are routed. The substrate is patterned in accord with interconnect requirements, a frame is then attached to the substrate by brazing or soldering or using sealing glass or by other technique, electrical components are attached to the substrate, the electrical components are connected, and finally a cover or cap is attached to hermetically seal the package. In the preferred embodiment, the substrate is fabricated from aluminum nitride and the substrate is patterned using thick film techniques. The cover is then readily bonded to the frame, resulting in a high performance package fabricated using economical processes and materials.

DESCRIPTION OF THE PREFERRED EMBODIMENT

Figure 1:
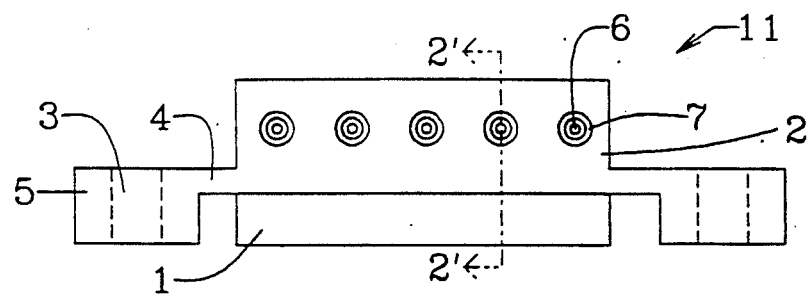
FIG. 1 illustrates an exterior side view of a package assembled in accord with the preferred embodiment.

FIG. 1 illustrates an exterior view of a package 11 assembled in accord with the preferred embodiment. Therein, a ceramic substrate 1, preferably of aluminum nitride, is attached to a metal frame 2. The metal frame 2, preferably fabricated from a material having expansion coefficients similar to substrate 1 such as a cobalt, nickel, iron alloy sold under the mark Kovar, acts both as a part of the hermetic sealing arrangement and also as the component clamping means and stress relief. It will be understood that Kovar is but one of a variety of known materials available for incorporation in a package of this nature. Cylindrical holes 3 pass through mounting flanges 5 to provide a method of attachment using bolts, screws or similar attachment means, while the somewhat thinner section 4 provides flexure between mounting flanges 5 and the hermetic region of the housing (21 in FIG. 2). The flexure provided by section 4 is important in minimizing stress on the ceramic to metal seal while simultaneously maintaining ample contact force between substrate 1 and any structure which supports the complete package 11.

The metal frame 2 has one or more electrical connections 6 provided through the metal frame 2 and insulated therefrom by, for example, sealing glass 7. The sealing glass and electrical feedthrough are produced and utilized in accord with established techniques familiar to one of ordinary skill.

The combined ceramic-metal package offers several advantages not heretofore known in the art. Particularly, ceramics are very hard, but tend to be brittle and also generally weaker in tension than in compression. The package designs illustrated in patents U.S Pat. Nos. 4,791,075 and 4,987,478 that illustrate ceramic substrates do not provide a known and effective way to mount the devices onto larger structures without sacrificing in complexity required for mounting, due in part to the brittle nature of the ceramics. The preferred embodiment of the present invention may simply be bolted into place by an operator of very little skill. No special precautions are required, as the package tends to be self-aligning, self positioning (once the holes are aligned), and self tensioning to maintain good thermal contact with a larger structure. In effect, the springs and other elastic materials relied upon in the prior art are unnecessary, as the thinner portions 4 provide required resilience.

Figure 2:
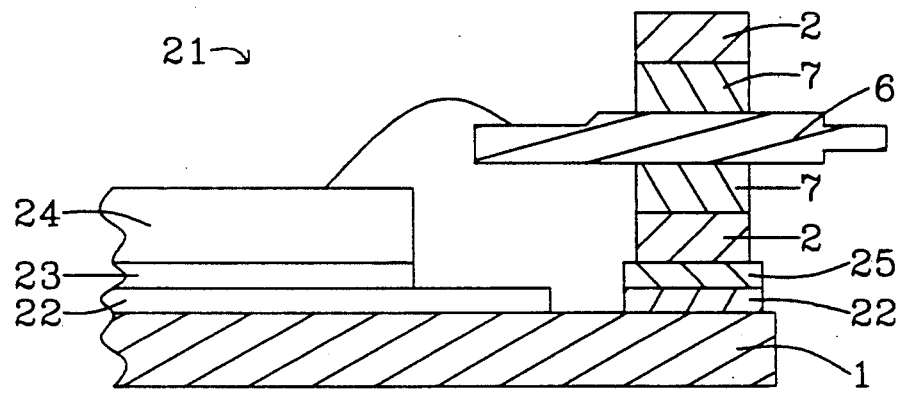
FIG. 2 illustrates a half cross-section view of FIG. 1 along section lines 2'.

FIG. 2 illustrates package 11 via a half cross-section taken along line 2' of FIG. 1. In the preferred embodiment, thick film metallization such as the "Copper Ink for Aluminum Nitride " disclosed in opening application Ser. No. 07/650,960 and assigned to the present assignee is provided to aluminum nitride substrate 1 in all desired wiring patterns and additionally in a narrow band near the periphery of the substrate. This thick film metallization provides a suitable surface that may be brazed or soldered to perform attachment to the substrate. Additionally, this method of attachment provides sufficient adhesion to repeatedly and reliably produce hermetic seals. The metal frame 2 is brazed to the aluminum nitride substrate 1 via the copper thick film metallization 22 and additional brazing material 25 that might typically be composed of flux and metal first. Alternatively, one of a variety of well known sealing glasses may be used to attach the metal frame to the copper metallization to produce a hermetic seal. The frame 2 has a copper lead 6 and matched glass to metal seal 7 extending therethrough.

Silicon chip 24 is attached to thick film metallization 22 through epoxy or solder 23, taking care to ensure that thermal conductivity is not adversely affected by the use of a poor thermal conductor. Although silicon chip 24 is illustrated for exemplary purposes, any electrical component or circuitry might be used in this package. Where epoxy is used, a thermally conductive filler should be included to prevent undesirable degradation of heat transfer. Because aluminum nitride provides a coefficient of thermal expansion very similar to silicon, the component arrangement described herein does not require the use of special molybdenum, tungsten or other refractory metal layers, nor is an unusually resilient, plastic or deformable layer required to absorb differences in expansion such as was illustrated in the prior art. Using the aforementioned construction techniques allows a substrate to be screen printed and fired with a thick film ink using processes well established and most cost effective, followed by similarly established and cost effective brazing and soldering operations. Once the metal frame 2 and silicon chip 24 are attached, a wire bonding process is generally used to interconnect the silicon chip 24 to the copper leads 6. In some instances it may be desirable to use the thick film metallization 22 to interconnect the silicon chip 24 to metal frame 2, generally where the metal frame 2 or bolt-down sites 3 at mounting flanges 5 will be used as one electrical connection.

Using the aforementioned construction also offers much benefit in improved thermal conductivity. Two interface layers are eliminated, thereby reducing thermal barriers and simultaneously removing two potential failure sites. Thermal grease may be included to improve thermal dissipation by five to ten percent, but this construction does not require thermal grease.

Figure 3:
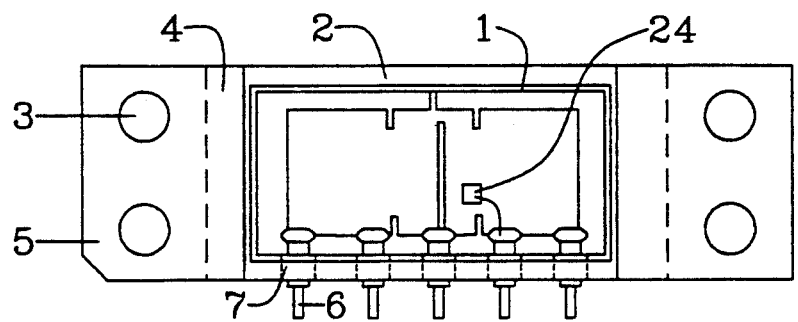
FIG. 3 illustrates an exterior top view of FIG. 1.

FIG. 3 illustrates by exterior top view with the cover removed the device illustrated in FIGS. 1 and 2. All elements have been like numbered and are as described with reference to FIGS. 1 and 2.

While the foregoing details what is felt to be the preferred embodiment of the invention, no material limitations to the scope of the claimed invention is intended. Further, features and design alternatives that would be obvious to one of ordinary skill in the art are considered to be incorporated herein. The scope of the invention is set forth and particularly described in the claims hereinbelow.

What is claimed is:

1. An hermetic package for electrical and electronic components, said package configured to be mounted upon a supporting structure, comprising:

a substantially planar electrically non-conductive ceramic substrate having a first electrical conductor patterned thereon;

a covering means adhered to said substrate, said covering means said substrate forming an hermetic enclosure;

a first electrical component, relatively more thermally dissipating than said first electrical conductor, electrically connected to said first electrical conductor and hermetically contained within said covering means and said substrate;

said covering means having flange means extending in a direction parallel to said planar substrate beyond said planar substrate;

said flange means being configured for securement to said supporting structure, said flange means having a resilient means to deform preferentially to a remainder of said flange means when said package is secured to said supporting structure.

2. The hermetic package for electrical and electronic components of claim 1 wherein said substantially planar electrically non-conductive substrate is composed of aluminum nitride.

3. The hermetic package for electrical and electronic components of claim 1 wherein said covering means and said substrate are brazed to each other using a copper thick film composition patterned upon said substrate.

4. The hermetic package for electrical and electronic components of claim 1 wherein said flange means comprises a cylindrical opening aligned generally perpendicular to said planar substrate, and said resilient means comprises a region of lesser thickness than said axial length of said cylindrical opening interconnecting said wall and said covering means, whereby said region of lesser thickness deforms preferentially to minimize stresses between said substrate and said supporting structure.

5. The hermetic package of claim 4 further comprising a mounting means passing within said cylindrical opening.

6. The hermetic package of claim 1 wherein said first electrical component comprises a semiconductor device.

7. The hermetic package of claim 6 wherein said semiconductor device comprises a transistor.

8. The hermetic package of claim 1 wherein said covering means comprises a metallic composition.

9. The hermetic package of claim 8 wherein said covering means comprises an iron, nickel and cobalt alloy.

10. The hermetic package of claim 2 wherein said covering means comprises a metallic composition.

11. The hermetic package of claim 2 wherein said covering means comprises an iron, nickel and cobalt alloy.

* * * * *